United States Patent
Lefferts et al.

(10) Patent No.: US 11,334,705 B2
(45) Date of Patent: May 17, 2022

(54) ELECTRICAL CIRCUIT DESIGN USING CELLS WITH METAL LINES

(71) Applicant: Synopsys, Inc., Mountain View, CA (US)

(72) Inventors: Robert B. Lefferts, Portland, OR (US); Naveen John, Hillsboro, OR (US); Luis Jose H. Alves, Maia (PT); Amanda J. Woon-Fat, Toronto (CA); Neelakantan Gopalan, Saratoga, CA (US); Menaka Chandramohan, Toronto (CA)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/114,233

(22) Filed: Dec. 7, 2020

(65) Prior Publication Data
US 2021/0173999 A1 Jun. 10, 2021

Related U.S. Application Data

(60) Provisional application No. 62/945,804, filed on Dec. 9, 2019.

(51) Int. Cl.
*G06F 30/00* (2020.01)
*G06F 30/398* (2020.01)
(Continued)

(52) U.S. Cl.
CPC ........ *G06F 30/398* (2020.01); *H01L 27/0207* (2013.01); *H01L 27/11803* (2013.01)

(58) Field of Classification Search
CPC .. G06F 30/398; G06F 30/367; G06F 30/3323; H01L 27/0207; H01L 27/11803
See application file for complete search history.

(56) References Cited

U.S. PATENT DOCUMENTS

| | | | |
|---|---|---|---|
| 7,007,258 B2* | 2/2006 | Li | G06F 30/39 716/122 |
| 7,343,570 B2* | 3/2008 | Bowers | G06F 30/327 716/121 |

(Continued)

OTHER PUBLICATIONS

International Search Report and Written Opinion Applicaiton No. PCT/US2020/063118 dated Mar. 5, 2021 consists of 15 pages.

(Continued)

*Primary Examiner* — Naum Levin
(74) *Attorney, Agent, or Firm* — Patterson + Sheridan, LLP

(57) ABSTRACT

A system and method for providing electrical circuit design using cells with metal lines are described herein. According to one embodiment, a method includes instantiating a first parameterized cell (PCELL) into a first region of a row of an electrical circuit design. The first PCELL includes field effect transistor (FET) data representing a FET structure having a horizontal dimension and first metal track data representing a first set of adjustable parallel metal line segments extending along the horizontal dimension of the FET structure. The method also includes instantiating a second PCELL into a second region of the row adjacent to the first region. The second PCELL includes second metal track data representing a second set of adjustable parallel metal line segments. The method further includes connecting the first set of adjustable parallel metal line segments to the second set of adjustable parallel metal line segments and eliminating a connectivity short.

19 Claims, 10 Drawing Sheets
(5 of 10 Drawing Sheet(s) Filed in Color)

(51) Int. Cl.
*H01L 27/02* (2006.01)
*H01L 27/118* (2006.01)

(56) References Cited

U.S. PATENT DOCUMENTS

| | | | | |
|---|---|---|---|---|
| 8,046,730 | B1* | 10/2011 | Ferguson | G06F 30/39 |
| | | | | 716/139 |
| 8,230,375 | B2* | 7/2012 | Madurawe | G06F 30/39 |
| | | | | 716/117 |
| 8,661,392 | B2* | 2/2014 | Quandt | H01L 27/11807 |
| | | | | 716/122 |
| 8,984,458 | B2* | 3/2015 | Giffel | G06F 30/33 |
| | | | | 716/112 |
| 9,690,893 | B1* | 6/2017 | Ferguson | G06F 30/392 |
| 9,690,896 | B2* | 6/2017 | Seo | H01L 23/528 |
| 9,773,772 | B2* | 9/2017 | Lee | H01L 27/0207 |
| 9,977,854 | B2* | 5/2018 | Rowhani | G06F 30/394 |
| 10,002,881 | B2* | 6/2018 | Datta | H01L 27/0207 |
| 10,019,332 | B1* | 7/2018 | Sehgal | G06F 11/24 |
| 10,147,684 | B1* | 12/2018 | Kuchanuri | H01L 27/11807 |
| 10,339,249 | B2* | 7/2019 | Lefferts | G06F 30/398 |
| 10,460,069 | B1 | 10/2019 | Burdick et al. | |
| 10,559,558 | B2* | 2/2020 | Chang | G06F 30/392 |
| 11,043,428 | B2* | 6/2021 | Kim | G06F 30/392 |
| 11,139,241 | B2* | 10/2021 | Morrow | H01L 29/41791 |
| 2013/0185687 | A1 | 7/2013 | Chung et al. | |

OTHER PUBLICATIONS

Guilherme Davie, et al. "Automatic Layout Generation of Power MOSFET Transistors in Bulk CMOS" 2014, 21st, IEEE International Conference on Electronics, Circuits and Systems Dec. 7, 2014.

* cited by examiner

ELECTRICAL CIRCUIT DESIGN USING CELLS WITH METAL LINES

RELATED APPLICATIONS AND CLAIM TO PRIORITY

This application claims priority to U.S. Provisional Application No. 62/945,804 filed Dec. 9, 2019 and titled "EFFICIENT LAYOUT METHOD FOR MIXED-SIGNAL ANALOG CIRCUITS ON ADVANCED FINFET TECHNOLOGIES," which is incorporated herein by reference.

TECHNICAL FIELD

The present disclosure relates to electronic design automation (EDA) software tools utilized to develop circuit designs prior to the fabrication of integrated circuit (IC) devices using the completed (fully-developed) circuit designs. More specifically, this disclosure relates to EDA software tools and associated parameterized cells (PCELLs) utilized during the development of mixed-signal analog integrated circuit (IC) devices that implement advanced field effect transistor (FET) technologies.

BACKGROUND

Advanced fin field effect transistor (finFET) fabrication technologies present challenges to the layout of mixed-signal analog circuits (e.g., during the generation of lower-abstraction-level descriptions of mixed-signal analog circuit designs). Due to the sensitive nature of these designs, many of which are running at 5 to 10 times that of digital clock rates, the generation of mixed-signal analog circuit layouts is performed by users using an EDA system, and involves manually arranging and interconnecting the various devices in a layout description based on details provided in a schematic.

A user (e.g., a mask designer), however, must make many design choices that often generate errors. For example, mixed-signal analog circuits fabricated using advanced fabrication processes typically include a number of finFETs placed in rows and interconnected using metallization that extends over the finFETs. A user may manually place parameterized cells (PCELLs) for the finFETs, metallization, and via/contact structures into locations along a row of the design. The user then manually connects the source/drain/gate terminals in the PCELLs to the metallization by way of the via/contact structures. For each connection, the user chooses from a range of first metal wire segment details (e.g., widths and pitches) and from a number of via/contact structures. The user, however, may make non-optimal choices that create electromigration, performance, and design rule check (DRC) issues, and these non-optimal choices must later be corrected. In some instances, nearly 50% of the DRC clean-up effort may involve corrections to first metal structures to address DRC and electromigration issues.

Some users may attempt to reduce the number of design choices by placing metallization that extends across an entire row of PCELLs or finFETs. A typical EDA system, however, considers this metallization to be part of one net and so, when the different PCELLs in the row couple to this metallization, the EDA system may detect connectivity shorts across entire metal lines of the metallization. Because the shorts are detected across large portions of a row, it is not clear where a cut layer should be drawn to remove the short between devices.

SUMMARY

According to an embodiment, a method includes instantiating a first parameterized cell (PCELL) into a first region of a row of an electrical circuit design. The first PCELL includes field effect transistor (FET) data representing a FET structure having a horizontal dimension and first metal track data representing a first set of adjustable parallel metal line segments extending along the horizontal dimension of the FET structure and positioned above the FET structure. The method also includes instantiating a second PCELL into a second region of the row. The second region is adjacent to the first region. The second PCELL includes second metal track data representing a second set of adjustable parallel metal line segments. The method further includes connecting the first set of adjustable parallel metal line segments to the second set of adjustable parallel metal line segments and eliminating a connectivity short by breaking a connection between a metal line segment of the first set of adjustable parallel metal line segments and a metal line segment of the second set of adjustable parallel metal line segments at an adjustable location.

The method may also include adjusting an instance terminal of the metal line segment of the first set of adjustable parallel metal line segments after eliminating the connectivity short.

The first PCELL may include via/contact data representing a plurality of via/contact structures. Each via/contact structure of the plurality of via/contact structures is operably connected between one of a source terminal, a drain terminal, and a gate terminal of the FET structure and a metal line segment of the first set of adjustable parallel metal line segments. A first via/contact structure of the plurality of via/contact structures and a second via/contact structure of the plurality of via/contact structures may be operably connected between the source terminal and a metal line segment of the first set of adjustable parallel metal line segments. The method may include setting a location of a via/contact structure of the plurality of via/contact structures based on connections between the first set of adjustable parallel metal line segments and the source, drain, and gate terminals. The method may include detecting the connectivity short based on the first metal track data, the second metal track data, and the via/contact data. The first set of adjustable parallel metal line segments and the plurality of via/contact structures may be design rule check (DRC) compliant.

A location of the connectivity short may correspond to a location of an abutment between the metal line segment of the second set of adjustable parallel metal line segments and the metal line segment of the first set of adjustable parallel metal line segments. The method may include highlighting the location of the abutment to indicate the connectivity short.

The method may also include inserting a cut shape above the connectivity short prior to breaking the connection.

The method may further include placing a guard ring structure or end cell around the FET structure.

The first PCELL and the second PCELL may be selected from a set of PCELLs and the first region and the second region may be selected from a set of regions in the row The method may also include removing a portion of a second metal line segment of the first set of adjustable parallel metal line segments, the portion extending to an edge of the second metal line segment.

According to another embodiment, an apparatus includes a memory and a hardware processor communicatively coupled to the memory. The hardware processor instantiates a first PCELL into a first region of a row of an electrical circuit design. The first PCELL includes field effect transistor (FET) data representing a FET structure having a horizontal dimension and including a source terminal, a drain terminal, and a gate terminal, first metal track data representing a first set of adjustable parallel metal line segments extending along the horizontal dimension of the FET structure and positioned above the FET structure, and via/contact data representing a plurality of via/contact structures. Each via/contact structure of the plurality of via/contact structures is operably connected between one of the source terminal, the drain terminal, and the gate terminal and a metal line segment of the first set of adjustable parallel metal line segments. The hardware processor also instantiates a second PCELL into a second region of the row. The second region is adjacent to the first region. The second PCELL includes second metal track data representing a second set of adjustable parallel metal line segments. The hardware processor further connects the first set of adjustable parallel metal line segments to the second set of adjustable parallel metal line segments and eliminates a determined connectivity short by breaking a connection between a metal line segment of the first set of adjustable parallel metal line segments and a metal line segment of the second set of adjustable parallel metal line segments at an adjustable location.

The hardware processor may also adjust an instance terminal of the metal line segment of the first parallel metal line segments after eliminating the connectivity short.

A first via/contact structure of the plurality of via/contact structures and a second via/contact structure of the plurality of via/contact structures may be operably connected between the source terminal and a metal line segment of the first set of adjustable parallel metal line segments.

The hardware processor may further adjust a location of a via/contact structure of the plurality of via/contact structures based on connections between the first set of adjustable parallel metal line segments and the source, drain, and gate terminals.

The hardware processor may also detect the connectivity short based on the first metal track data, the second metal track data, and the via/contact data.

A location of the connectivity short may correspond to a location of an abutment between the metal line segment of the second set of adjustable parallel metal line segments and the metal line segment of the first set of adjustable parallel metal line segments.

According to another embodiment, a layout may include a first parameterized cell (PCELL) and a second PCELL. The first PCELL is in a first region of a row of an electrical circuit design. The first PCELL includes field effect transistor (FET) data representing a FET structure having a horizontal dimension and first metal track data representing a first set of adjustable parallel metal line segments extending along the horizontal dimension of the FET structure and positioned above the FET structure. The second PCELL is in a second region of the row. The second region is adjacent to the first region. The second PCELL includes second metal track data representing a second set of adjustable parallel metal line segments. The first set of adjustable parallel metal line segments are connected to the second set of adjustable parallel metal line segments.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
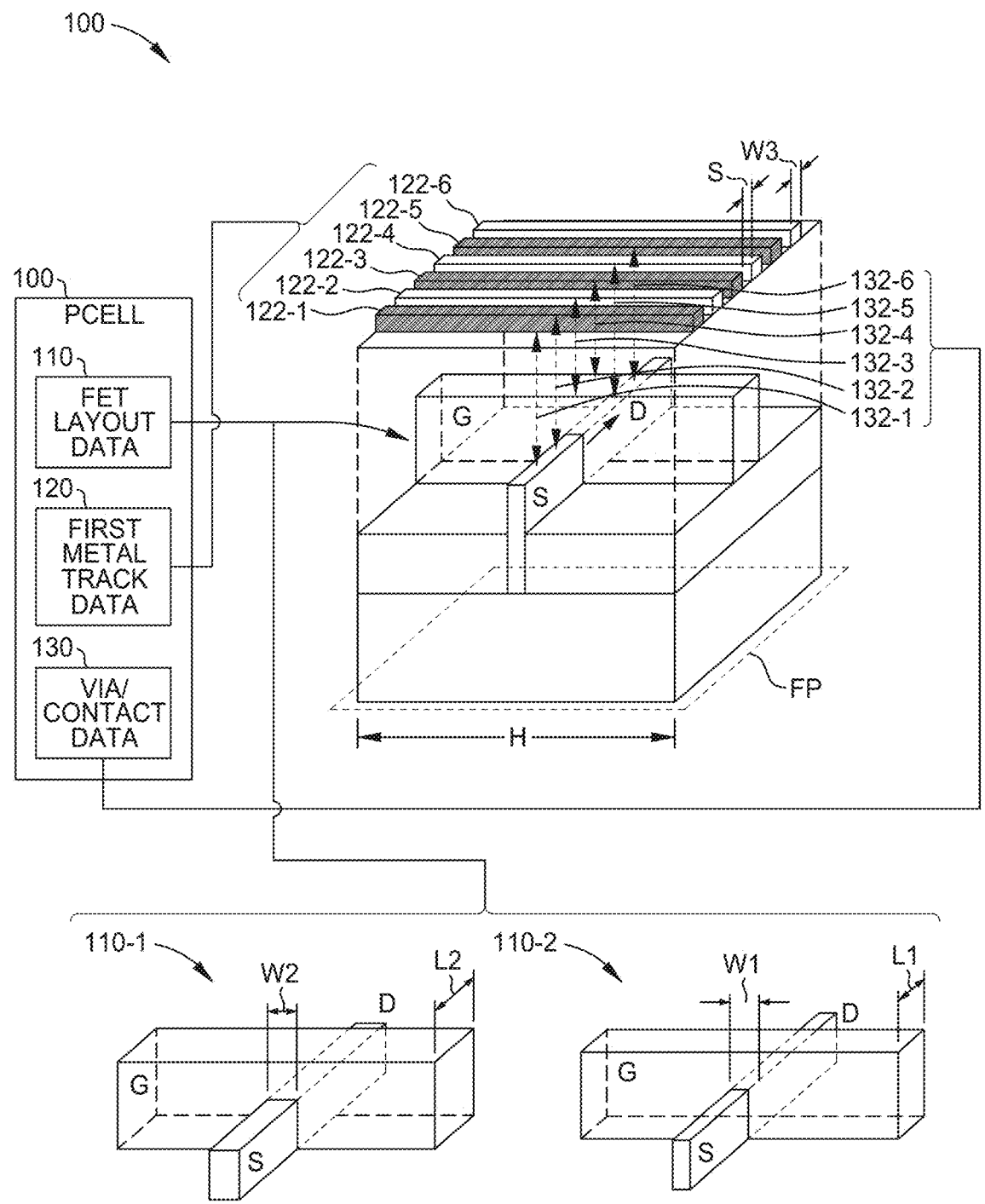
FIG. 1 illustrates an example parameterized cell.

Aspects of the present disclosure relate to electrical circuit design using cells with metal lines. Electronic design automation (EDA) systems may provide parameterized cells (PCELLs), also referred to as programmable cells, that can be used to design electric circuits (e.g., field effect transistor (FET) devices such as fin field effect transistor (finFET) devices or planar FET devices). PCELLs include a generalized layout footprint that accommodates one of multiple possible specific layout descriptions (e.g., layout descriptions for different finFET structures) that a user may select. The EDA system allows a user to insert PCELLs, metallization, and via structures into a design and to manually connect the PCELLs using the metallization and via structures. This manual process may result in errors. For example, the positioning of the metallization and via structures may create electromigration and DRC issues. As another example, if the user chooses a metallization that extends across an entire row of the design to simplify connectivity, this design will create connectivity shorts across the entire metallization when the via structures electrically connect the metallization and the underlying FET structures. Because the connectivity short is identified as occurring across a metal line, it will be difficult for the user to determine where to cut the metal line to resolve the connectivity short. Moreover, there may be no EDA systems that can automatically convert schematic (intermediate level) mixed signal analog circuit descriptions into layout (lower-abstraction-level) descriptions.

This disclosure describes an EDA system that provide efficient layout techniques that minimize or avoid the problems associated with conventional layout methods and EDA systems, in certain embodiments. In particular, the EDA system facilitates rapid placement and routing of FETs (e.g., finFETs) arranged in rows in a manner that reduces development time and iteration while ensuring middle end of line (MEOL) and first metal DRC compliance. Generally, the EDA system utilizes PCELLs that include (i) FET data that represents a FET structure, (ii) first metal data that represents metal lines that run across the horizontal dimension of the FET structure (also referred to as the first metal or the first metal tracks), and (iii) via/contact data that represents via/contact structures that connect regions of the FET structure to the metal lines. A user may insert these PCELLs across a row of the design, and the EDA system automatically connects or abuts the metal lines of adjacent PCELLs. If a connectivity short is detected across abutted metal lines, the EDA system can isolate the exact short location between two metal lines, rather than detecting the short across an entire row of connected metal lines. As a result, the EDA system can indicate to the user where a cut should be made to resolve the connectivity short. Using these marker locations, an auto-cut tool is used to remove the connectivity shorts between adjacent devices. In particular embodiments, the EDA system correctly detects connectivity errors and automatically generates layer modifications or additions (e.g., metal cut shapes) to resolve these errors. Generally, the EDA system and its features may be implemented through a separate utility or embedded PCELL feature by a computer system, such as the computer system 1300 illustrated in FIG. 9.

Generally, the EDA system includes a multitude of features that contribute to the described layout method. The EDA system may implement a subset of these features and still provide a significant advantage over conventional methods. Some of these features include the following.

1. PCELLs that include a first metal: The present EDA system creates PCELLs that contain a parameter that defines the metal tracks (e.g., wire widths, pitches, and wire locations). The metal tracks are defined to run from a first side (e.g., left side) to a second side (e.g., right side) of the PCELL. The PCELLs also include data that represents additional instance terminals that accommodate metal tracks in the PCELL that are not connected to FET terminals (e.g., finFET terminals). This effectively pushes the metal tracks down into the PCELL so the user does not need to route the metal tracks. The PCELL includes: (i) a programmable set of metal paths from the first side to the second side of the PCELL; (ii) a programmable number of instance terminals to support propagation of each metal track and the three FET terminals; and (iii) the ability to support propagation of nets through the PCELL that are not FET nets (e.g., a feed-through).

2. PCELLs that include vias at programmable locations: The PCELL includes data representing vias from the metal tracks down into the device layers inside the PCELL. These vias are placed at programmable locations for source, drain, and gate connections and support multiple connections per device terminal (e.g., 1-3). The present system may receive user instructions indicating how to connect vias to source/drain/gate instance terminals, which allows the system to know where to create additional instance terminals for unused metal tracks or metal shapes outside of a cut.

3. PCELL that supports cutting the metal inside the PCELL: The EDA system may cut metal drawn in the PCELL. The EDA system may provide a callback function (e.g., a procedure that gets called) when a cut shape is drawn over the PCELL and the coordinates of the cut shape are passed to the PCELL through the callback function.

4. PCELL and an EDA system that allows metals in the PCELLs to be cut: In many advanced technology nodes, there are several different techniques to enable breaking or cutting a metal path. In some technologies, the cut may be implemented on an additional mask layer that cuts the metal during fabrication. In this case, the EDA system breaks the connectivity under the cut. In many cases, a cut shape is not used, but instead the EDA system removes the metal and leaves a DRC clean metal gap. All combinations of the above are allowed and may be part of the described layout method.

5. A method for defining presets of reusable settings: The features of the programmable PCELLs are selected based on factors that are not limited to one or more of an application, a channel length, a device width, and a device type. The described layout method includes a way to preset these features based on the selected factors. The preset features allow a user to analyze design requirements for each channel length and width and to set the metal tracks based on optimal current handling capability, DRC, and routability. After the user selects the optimal configuration for a given device, these preset features can be stored in the EDA system. One such implementation uses a preset library where PCELL parameters are set during placement based on application, channel length, device width, and device type. This allows the user to start with a desired option rather than having to manually change these settings each time the user places a device. The preset library has multiple cells, each storing a preset for different applications or design optimizations.

6. A method to toggle source, drain, and gate vias post placement: The device presets in the preset library can contain selected options which are fixed and optimized for design optimization (e.g., the number of source and drain vias, and the number of gate vias). The device preset can also contain options which allows for the user to customize their source, drain, and gate connections on specific metal tracks depending on the required implementation. In the described layout method, a post placement procedure may be used to scan down the row of placed FET devices and to pre-assign the device connections to avoid connectivity shorts on shared source, drain, and gate connections.

7. A method to automatically add metal cuts to remove connectivity shorts on metal tracks: After placement, there may be connectivity shorts on the boundary of the PCELLs where metals abut between devices and where the first metal lines are on different nets. The connectivity engine in the EDA system may highlight these shorts at PCELL boundaries providing an effective way of walking thru the connectivity shorts and adding the cut shapes at the exact location of the connectivity short between devices. Features #3 and #4 are used to actually cut the metals so after the auto-cut method is applied, the design may be fully connectivity clean.

8. A method to automate the cutting of metals to minimize capacitance: Using the same method used by the auto-cutter in feature #7, the EDA system may include a tool-assisted method for the user to improve or reduce metal parasitics in the design. This tool will allow for the user to interactively click on metal locations and have DRC clean cuts added so they can trim wire stubs to reduce capacitance.

9. A method to automatically place guard ring or end cells around the placed FETs: The described layout method and EDA system may include an automated method to add guard rings or end cells around the placed devices. Because the devices may contain a parameter that defines the metal tracks, this automation can add guard rings and end cells that match the metal tracks and extend the metals in a DRC clean method to the edge of the placed block.

10. An automated way to add upper metal tracks from the preset library for routing: After device placement and auto-cutting, the EDA system may auto-populate upper metal tracks in preset locations of the design.

11. An automated way to route first metal paths/routes in upper metals: After Feature #8, the layout is DRC and connectivity clean up to the first metal. To help the user connect different device blocks together, an interactive or pattern router in the EDA system may quickly connect the first metal routes while maintaining the connectivity and DRC clean layout.

12. A method to allow a user to re-assign device connections: In some cases, the user may re-allocate signals to different metal tracks for optimal performance and capacitance. One such implementation allows the user to click on a device connection and toggle the via on and off.

In particular embodiments, the described layout method and EDA system provide a consistent methodology for a user to deploy best-practice in terms of metal track selection, electromigration, capacitance, consistency, and inter-operability between blocks. In addition, the described layout method and EDA system provide significant improvements in layout efficiency and the time needed to get a block fully layout versus schematic (LVS) and DRC clean. In addition to delivering best practice and consistent layout, the described layout method and EDA system may reduce the number of times the user needs to draw and correct shapes to meet DRC requirements and the number of DRC verification runs needed to get DRC clean layout by a significant factor. In some examples this EDA system can reduce layout development time by a factor of 20-50×.

FIG. 1 illustrates an example PCELL 100. In certain embodiments, the contemplated layout generation method (and associated EDA system) simplifies the layout process for mixed-signal analog circuit designs made up of FET devices (e.g., finFET devices or planar FET devices) arranged in (horizontal) rows by providing PCELLs 100 that include (i) FET layout data 110 representing multiple sets of preset FET layout feature dimensions (e.g., sets 110-1 and 110-2 include layout features with respective dimensions a first width/a first depth (W1/D1) and a second width/a second depth (W2/D2)), each layout feature set fitting within a footprint (FP) having a horizontal dimension H, (ii) first metal track data 120 representing multiple adjustable parallel DRC compliant first metal line segments 122-1 to 122-6 (with a third width W3 and spacing S), and (iii) optional via/contact data 130 representing pre-designated DRC compliant via/contact structures 132-1 to 132-6 connected between associated source/drain/gate terminals (S/D/G) of the FET layout description and corresponding first metal line segments 122-1 to 122-6.

In addition to providing the advantages of PCELLs (e.g., postponing final finFET layout feature dimension selection until signoff), the use of the present PCELLs 100 simplifies and reduces the time needed to perform mixed-signal analog circuit layout processes by reducing the total number of design choices in certain embodiments, thereby reducing errors and the associated clean-up efforts needed to achieve signoff. That is, instead of requiring a user to instantiate chosen first metal line segments and via/contact structures to connect a placed FET per conventional layout methods, the present layout generation method allows the user to designate all connections between the terminals S/D/G of a placed FET 100 by selecting a first line segment of the first metal line segments (e.g., 122-1 or 122-2) and an associated via/contact structure (e.g., 132-1 or 132-2) to establish a source terminal contact, a second line segment of the first metal line segments (e.g., 122-3 or 122-4) and an associated via/contact structure (e.g., 132-3 or 132-4) to establish a gate terminal contact, and a third line segment (e.g., 122-5 or 122-6) and an associated via/contact structure (e.g., 132-5 or 132-6) to establish a drain terminal contact. Unselected first metal line segments 122 may remain unconnected to S/D/G terminals or via/contact structures 132 of the PCELL 100. These first metal line segments 122 may be used to propagate signals from other PCELLs. Because the first metal line data 120 and via/contact data 130 stored with each enhanced PCELL 100 includes DRC clean and design requirement aware structures, the combination of first metal line structures and via/contact structures selected by a user to implement a given FET automatically produce a "correct-by-construction" layout, whereby the improved layout generation method reduces or eliminates errors that require significant manual layout design effort to achieve signoff.

Figure 2:
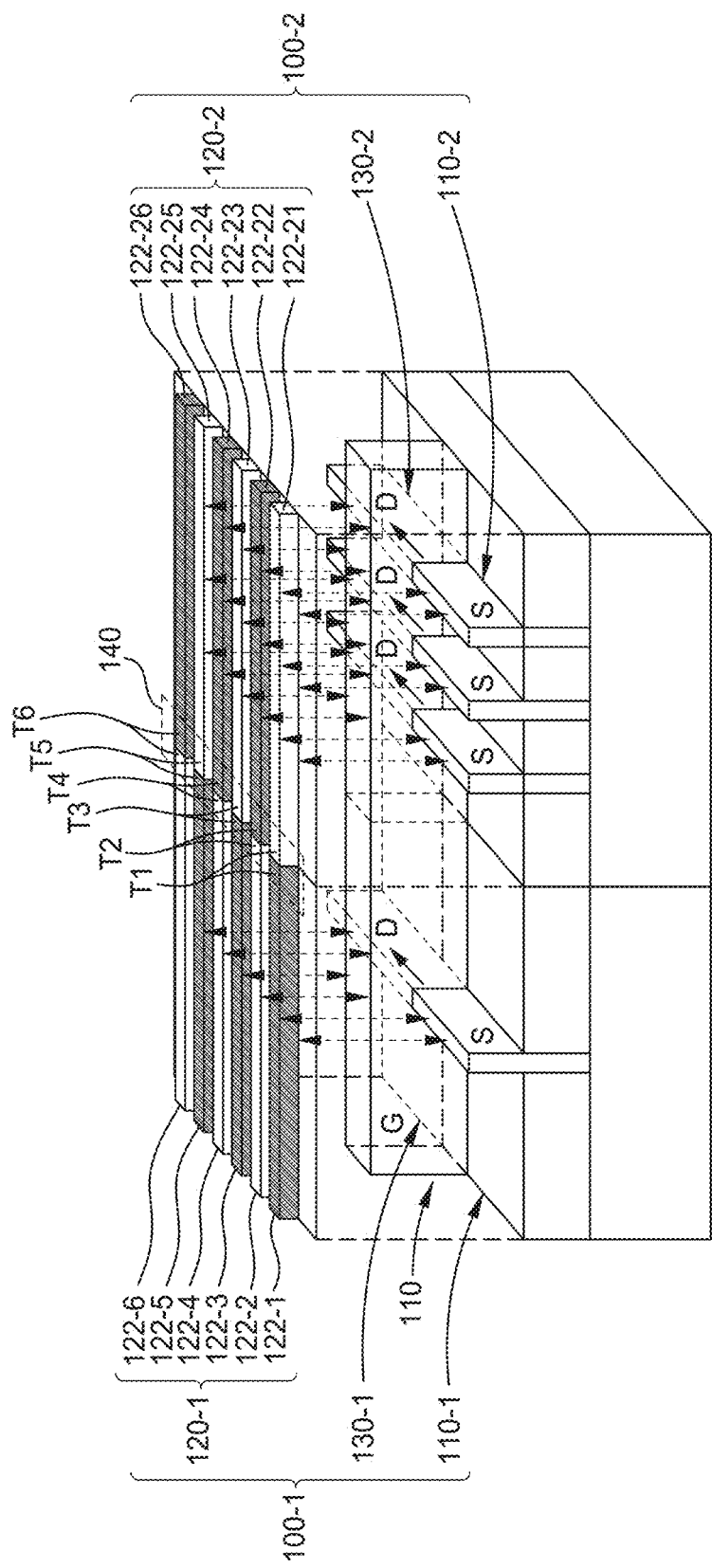
FIG. 2 illustrates example parameterized cells.

FIG. 2 illustrates example PCELLs 100-1 and 100-2. The PCELLs 100-1 and 100-2 may be separate instantiations of the PCELL 100 of FIG. 1. As seen in FIG. 2, the PCELLs 100-1 and 100-2 are instantiated in adjacent positions of the same row of a design. Generally, the EDA tool automatically connects the first metal lines 122-$x$ of the adjacent PCELLs 100-1 and 100-2 (where 'x' is a number that identifies a metal line, for example, x is a number from 1 through 6 in the example of FIG. 1).

The first metal track data 120 of each FET PCELL designed for a given fabrication node (e.g., 7 nanometer (nm) complementary metal oxide semiconductor (CMOS)) represents multiple parallel adjustable first metal line segments 122-1 to 122-6 having lengths that are equal to a horizontal dimension H of the FET footprint FP, and have size/spacing dimensions that are standardized to match other enhanced FET PCELLs generated for a given fabrication node. With this feature, when two different FET PCELLs from a given library are aligned in a horizontal row (e.g., single-fin PCELL 100-1 and three-fin PCELL 100-2 aligned), the multiple parallel adjustable first metal line segments 122-11 to 122-16 of one PCELL 100-1 align with the multiple parallel adjustable first metal line segments 122-21 to 122-26 of adjacent PCELLs (e.g., PCELL 100-2) disposed in the horizontal row. This arrangement facilitates efficient layouts including abutment of multiple FETs in the same row. When PCELLs 100 are instantiated in a single horizontal layout row, the multiple parallel first metal line structures 122-$x$ couple to form Metal-1 tracks T1 to T6. With this feature, the present PCELLs also propagate the connectivity of metal shapes drawn in the PCELL that are not connected to a PCELL's FET S/D/G terminals. The nets on these metal lines that are not used by the PCELL terminals are used to propagate the nets from FET devices to the left or right of each PCELL. Because the EDA system propagates the connectivity of metal wires 122-$x$ in the PCELL left and right, there may be conflicts between the nets of metal segments between two PCELLs that touch. These locations where metal segments touch and have conflicting net names is a connectivity short. The EDA tool detects and reports these connectivity shorts with a marker at the exact location between adjacent PCELLs that generated the connectivity short.

In particular embodiments, the EDA system adjusts the number or location of the metal line segments 122 in the PCELLs 100-1 or 100-2 so that these metal line segments 122 align. For example, the EDA system may adjust a number of metal line segments 122 in the PCELLs 100-1 or 100-2 if the PCELLs 100-1 or 100-2 have different numbers of metal line segments 122 when instantiated. As another example, the EDA system may adjust a location of one or more metal line segments 122 in the PCELLs 100-1 or 100-2 if the metal line segments 122 in the PCELLs 100-1 or 100-2 do not align with one another when the PCELLs 100-1 and 100-2 are instantiated. In this manner, the metal line segments 122 in the adjacent PCELLs 100-1 and 100-2 may connect to form the Metal-1 tracks T1 to T6.

To remove a connectivity short, the present EDA system generates a cut shape 140 over the short circuit on top of one or more PCELLs that will allow the PCELLs to remove the metal segment under the drawn shape. This removal can be done in one of two ways. Either the shape itself will remove the metal during fabrication, in which case the PCELL need only prevent metal under the shape from propagation connectivity, or the PCELL can remove the drawn metal segment underneath the drawn cut shape 140. The choice can be automated based on the technology and wire sizes. Automated placement of cut shape 140 at the connectivity short location over the PCELLs allows the user to create "correct-by-construction" layouts that are both DRC-clean and connectivity-clean up through the first metal and passing LVS checks. The cut shape 140 may be any suitable shape and overlap any suitable number of metal line segments 122. In certain embodiments, the location of the cut shape 140 is adjustable such that the location where the metal connection is broken (e.g., by metal removal) is adjustable.

Figure 3:
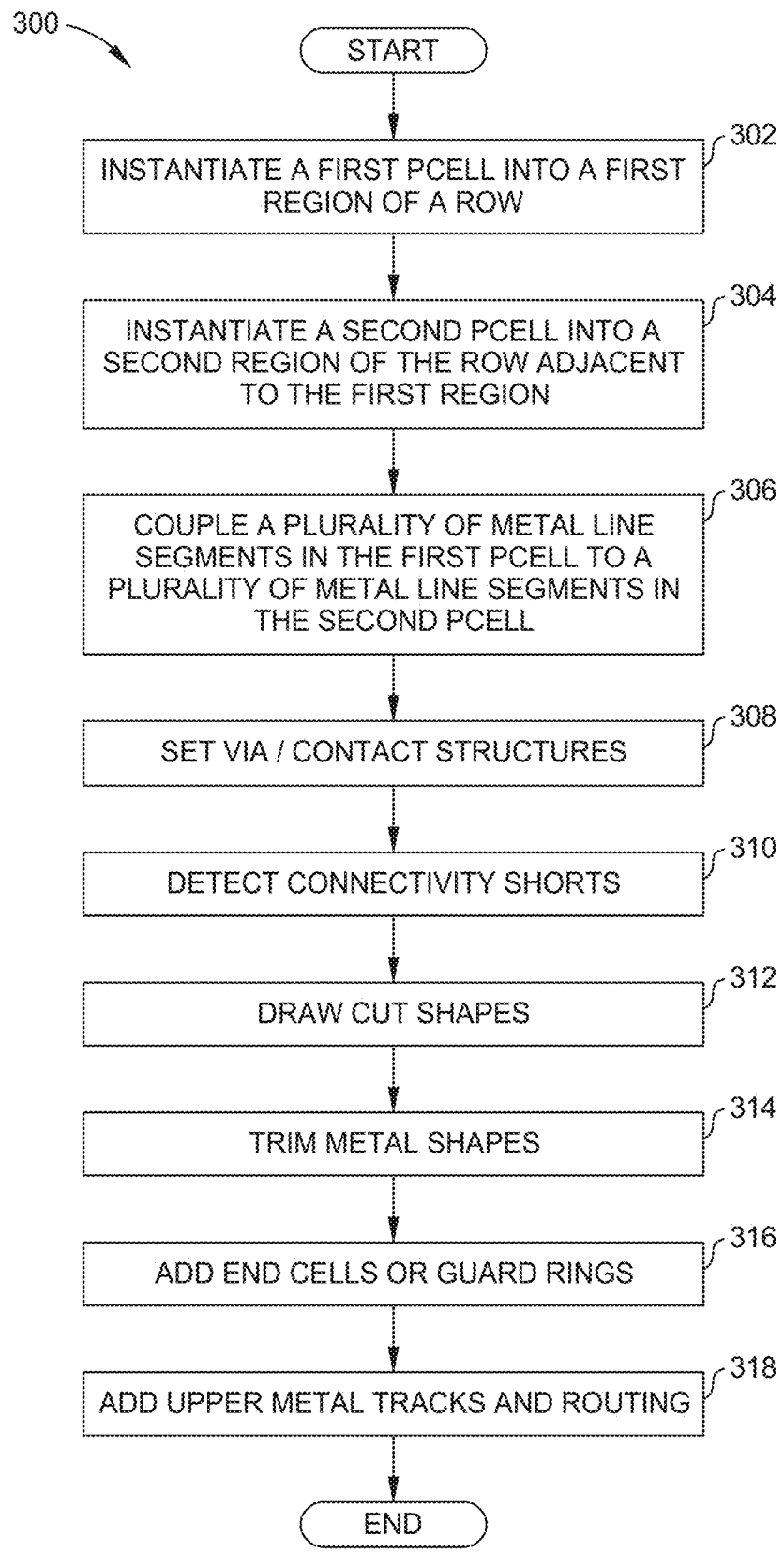
FIG. 3 is a flowchart of an example method for generating a layout.

FIG. 3 is a flowchart of an example method 300 for generating a layout. Generally, the computer system 900 shown in FIG. 9 implementing an EDA system performs the steps of the method 300. The computer-implemented EDA system generates mixed-signal analog circuit layout designs in response to user (e.g., a mask designer) commands using the enhanced PCELLs described above. As mentioned above, the PCELLs are typically aligned in horizontal rows in the layout design and interconnected in accordance with user-defined connectivity parameters. For clarity, the method 300 is discussed using the example illustrated in FIGS. 1 and 2.

In 302, the EDA system instantiates a first PCELL 100-1 into a first region of a row. The first PCELL 100-1 may include (i) FET data 110 representing a first FET structure (e.g., a finFET structure or a planar FET structure) that includes S/D/G terminals, (ii) first metal track data 120 representing adjustable first metal line segments 122-x that extend over the first FET structure, and (iii) via/contact data 130 representing via/contact structures that connect the S/D/G terminals to the metal line segments 122. The metal line segments 122-x may have a length equal to a horizontal dimension of the first FET structure.

In 304, the EDA system instantiates a second PCELL 100-2 into a second region of the row adjacent to the first region. Similar to the first PCELL 100-1, the second PCELL 100-2 may include (i) FET data 110 representing a second FET structure (e.g., a finFET structure or planar FET structure) that includes S/D/G terminals, (ii) first metal track data 120 representing adjustable first metal line segments 122-2x that extend over the second FET structure, and (iii) via/contact data 130 representing via/contact structures that connect the S/D/G terminals to the metal line segments 122-2x. The metal line segments 122 may have a length equal to a horizontal dimension of the first FET structure. In particular embodiments, the EDA system may adjust a number or location of the first metal line segments 122 in the first PCELL 100-1 or the second PCELL 100-2 such that the metal line segments 122 in the PCELLs 100-1 and 100-2 align.

In 306, the EDA system connects via abutment a plurality of metal line segments 122-x in the first PCELL 100-1 to a plurality of metal line segments 122-2x in the second PCELL 100-2. This abutment may form metal tracks Tx that extend across the first and second PCELLs 100-1 and 100-2. Although the metal line segments 122-x and 122-2x of the first and second PCELLS 100-1 and 100-2 are connected via abutment together, they may still belong to different nets.

In 308, the EDA system instantiates via/contact structures that connect the S/D/G terminals of the first PCELL 100-1 to one or more of the metal line segments 122-x of the first PCELL 100-1 and that connect the S/D/G terminals of the second PCELL 100-2 to one or more of the metal line segments 122-2x of the second PCELL 100-2. These via/contact structures may be automatically or interactively instantiated based on design requirements provided by a user. For example, the user may select a via/contact size and a metal line segment in the EDA system to connect the via/contact structure to the metal line segment. In certain embodiments, 308 is optional or may be automatically performed by the EDA system.

In 310, the EDA system detects a connectivity short in the abutment between a metal line segment 122-x and a metal line segment 122-2x. For example, the EDA system may detect the connectivity short by determining that metal line segments 122-x and 122-2x belong to two different nets which are connected to different adjacent FET structures (e.g., different terminals of different finFET structures). The EDA system may determine that this connectivity short corresponds to the location of the abutment of the two metal line segments 122-x and 122-2x. Additionally, the EDA system may highlight this location to indicate to a user that the connectivity short can be resolved by forming a cut at that location. In 312, the EDA system draws one or more cut shapes 140 over the detected net shorts to indicate where cuts should be made to resolve the connectivity shorts. The EDA system may add a metal cut or form breaks in the metal underneath the cut shape 140 to resolve the connectivity short. In certain embodiments, the location of the cut shape 140, the metal cut, or breaks is adjustable. In particular embodiments, the EDA system adjusts instance terminals after the cut or break is formed. For example, the EDA system may let one of the metal line segments keep its original instance terminal and assign a new instance terminal to the other metal line segment to indicate that the two metal line segments belong to two different nets after the cut or break.

In 314, the EDA system may allow the user to trim metal shapes using an interactive tool-assisted function which adds cut shapes 140 over sections of the metal line segments 122-x and 122-2x in order to reduce parasitics to optimize circuit performance.

In 316, the EDA system may automatically add the required end of row FET structures and shapes to meet the DRC requirements. The EDA system can also automatically add n-well and/or p-substrate guard rings, end cells, or taps in order to meet LVS design requirements. The EDA system can automatically add these end cells and guard rings which have been pre-designed and optimized to meet DRC rules.

In 318, the EDA system may add upper metal tracks in an automated way for routing and connectivity of the first metal path segments 122-x and 122-2x between different device placement rows or between blocks. The metal tracks can be used to create tool-assisted automatic routing between FET device rows which is DRC and connectivity clean.

Figure 4:
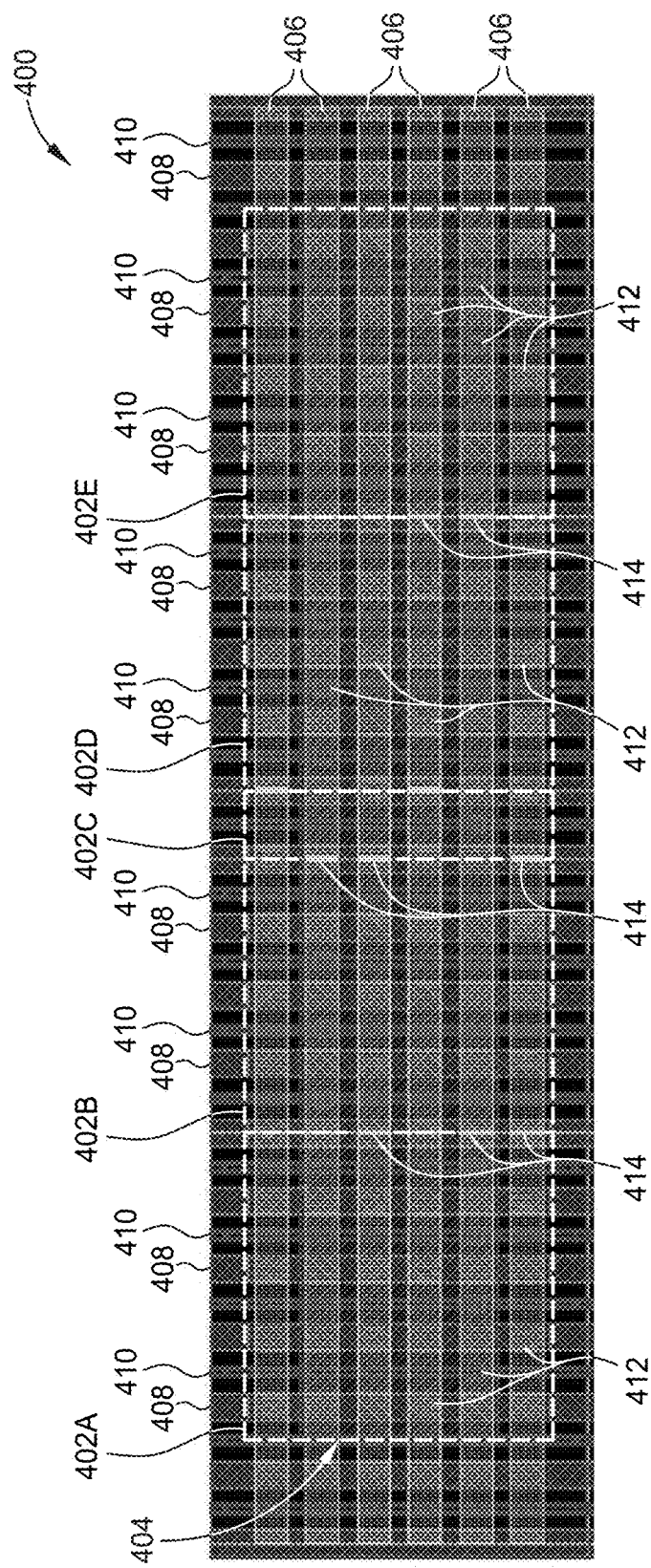
FIG. 4 illustrates an example layout.
Figure 9:
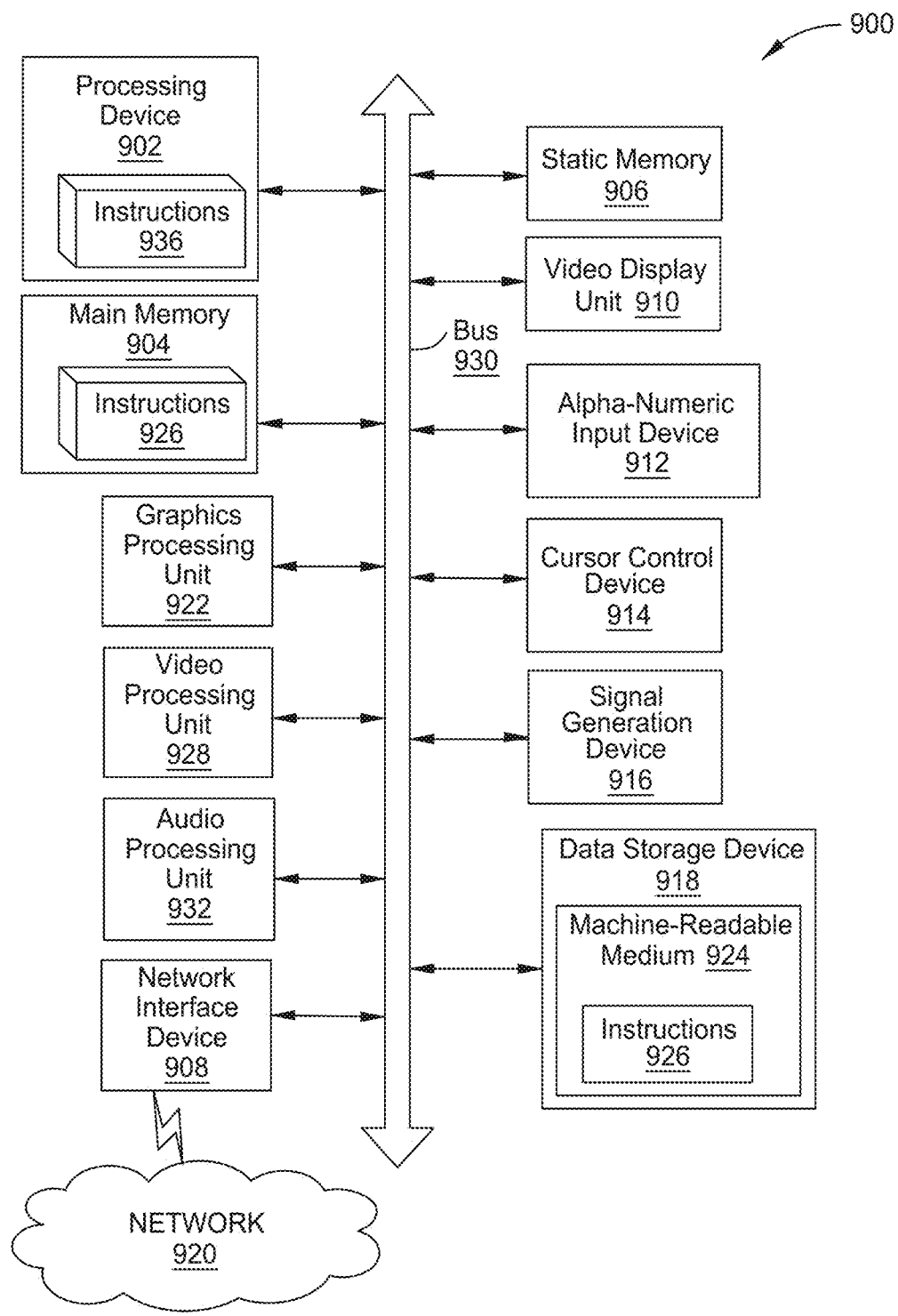
FIG. 9 depicts an abstract diagram of an example computer system in which embodiments of the present disclosure may operate.

FIG. 4 illustrates an example layout 400 generated using the described EDA system (e.g., using the computer system 900 shown in FIG. 9). The layout 400 in FIG. 4 includes only one row of five PCELLs 402A, 402B, 402C, 402D, and 402E, but layouts generated using the EDA system may include any suitable number of rows with any suitable number of PCELLs. PCELL 402A is adjacent to PCELL 402B. PCELL 402B is adjacent to PCELLs 402A and 402C. PCELL 402C is a dummy cell added to keep the active fin area 804 (the red-purple rectangular regions in the two rows) continuous. PCELL 402D is adjacent to PCELLs 402C and 402E. PCELL 402E is adjacent to PCELL 402D.

The layout 400 includes multiple gates 410 (shown in blue) and inter-connect device layers 408 (shown in green). To preserve the clarity of FIG. 4, not all of the gates 410 and inter-connect device layers 408 in FIG. 4 have been labeled. First metal tracks 406 (shown by light pink horizontal rectangular strips) are formed by connecting first metal lines in the adjacent cells 402. Via/contact structures 412 that connect the first metal tracks 406 (or more specifically, the first metal lines in the first metal tracks 406) to the source/drain/gate regions in the cells are indicated by red squares at the intersection of the first metal tracks 406 and the gates 410 and local inter-connect device layers 408. To preserve the clarity of FIG. 4, not all of the via/contact structures 412 in FIG. 4 have been labeled.

As discussed previously, because the first metal data is included in each PCELL 402 and belong to distinct nets, the EDA tool can detect connectivity shorts 414 that are isolated at the boundary connection between PCELLs rather than extending across a long segment of a metal track 406 (e.g., by detecting when two metal lines belonging to different nets couple together at the boundary of two PCELLs). The EDA system may also highlight the locations of these connectivity shorts 414 for a user. In the layout 400, the detected shorts 414 are isolated to certain abutment points of the first metal lines of two cells 402. The EDA system highlights these connectivity shorts 414 at certain connection points between cells 402. In certain embodiments, the EDA system may determine the placement and connections of metal lines and vias such that the connectivity shorts 414 are formed away from vias (e.g., to make cutting easier). To preserve the clarity of FIG. 4, not all of the detected short circuits 414 in FIG. 4 have been labeled, but they nevertheless appear as yellow-highlighted slivers at the boundaries of the cells 402.

Generally, applying the described layout method 300 produces the layout 400 (e.g., Features #1, #2, #5, and #6 described above) that allocates the via locations. The layout 400 may be generated in less than two minutes using the described layout method 300 and EDA system in one example.

Figure 5:
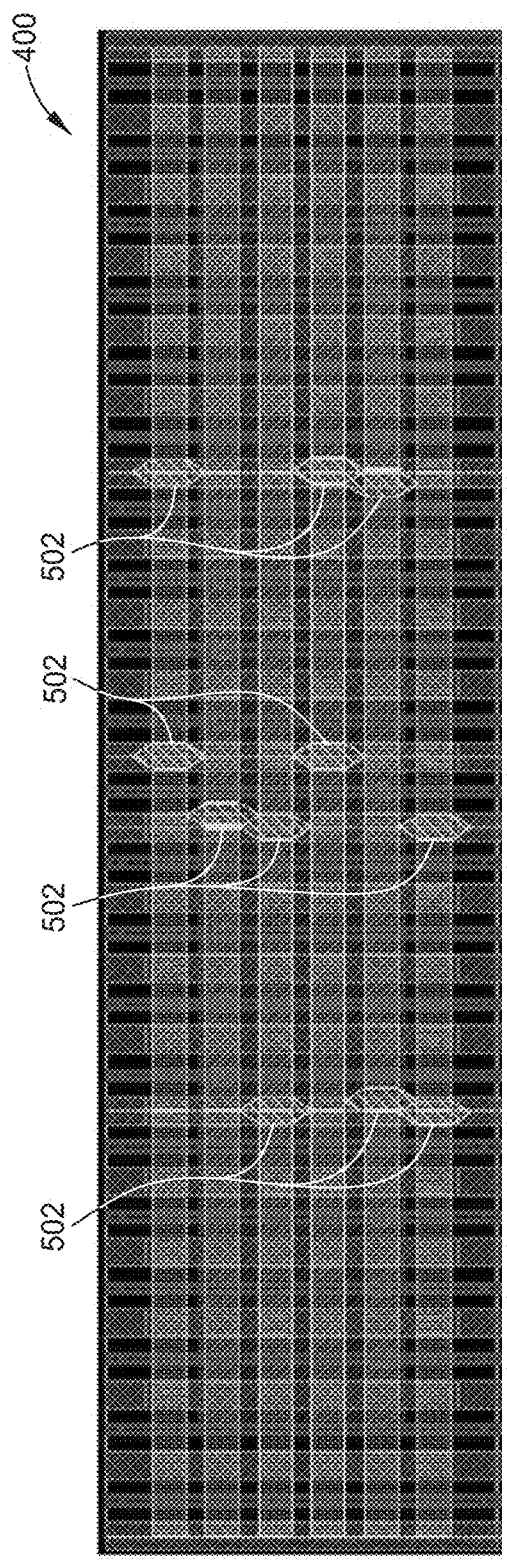
FIG. 5 illustrates an example layout.

FIG. 5 illustrates the example layout 400 with cut shapes 502 added. Feature #7 described above, the auto-cutter, which uses Features #3 and #4, can be run on the layout 400 to draw cut shapes 502 in a DRC-aware manner that during fabrication will cut the first metal. Features #3 and #4 propagate the cut down into the PCELL and break the connectivity. This figure illustrates the cut shapes as trapezoidal as shown in the example of FIG. 5.

Figure 6:
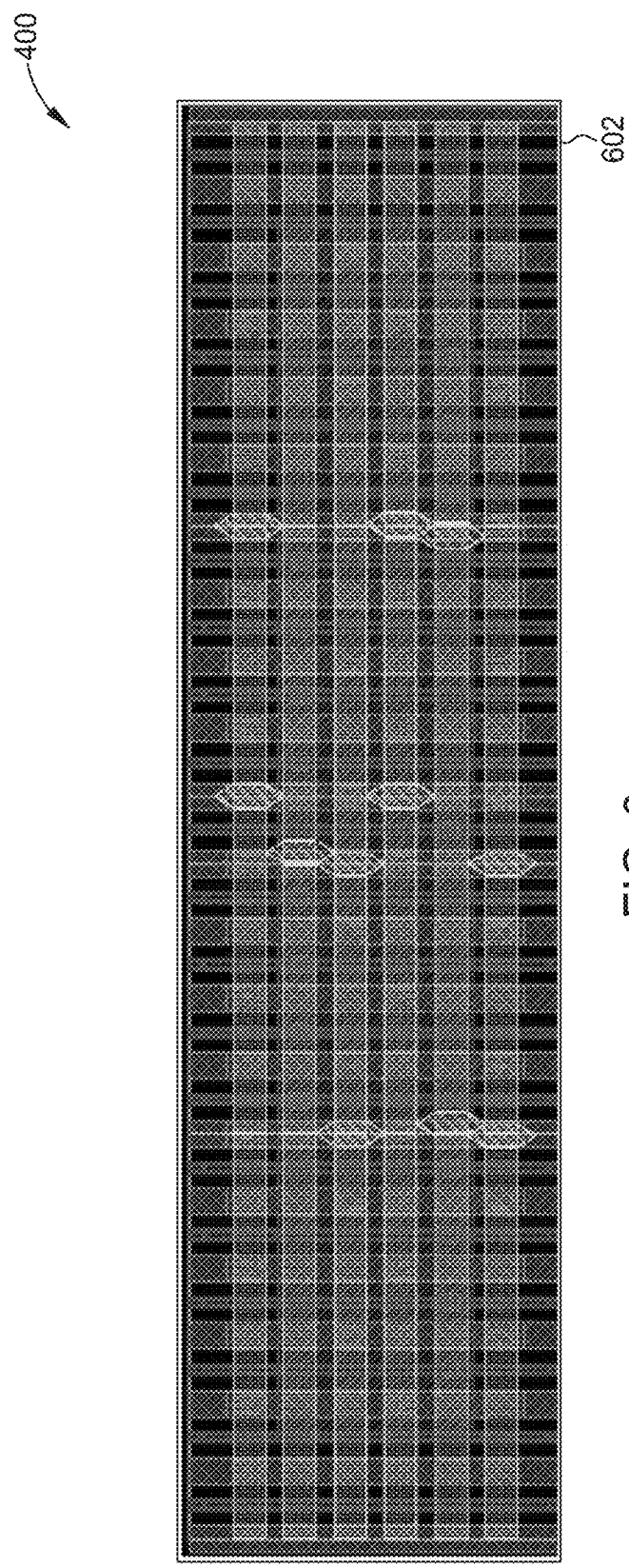
FIG. 6 illustrates an example layout.

FIG. 6 illustrates the example layout 400 and a guard ring 602. Feature #9 described above adds a guard ring 602 around the device. This guard ring 602 helps provide a transition region around the layout 400.

Figure 7A:
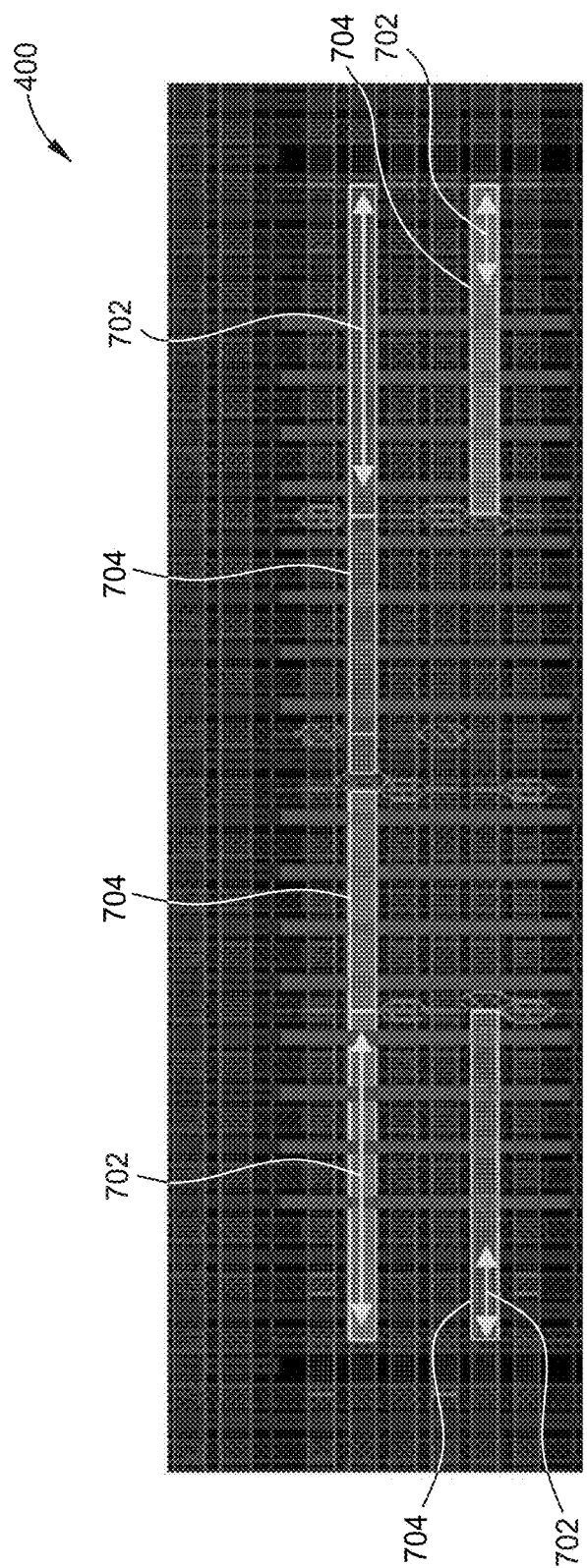
FIGS. 7A and 7B illustrate an example layout.
Figure 7B:
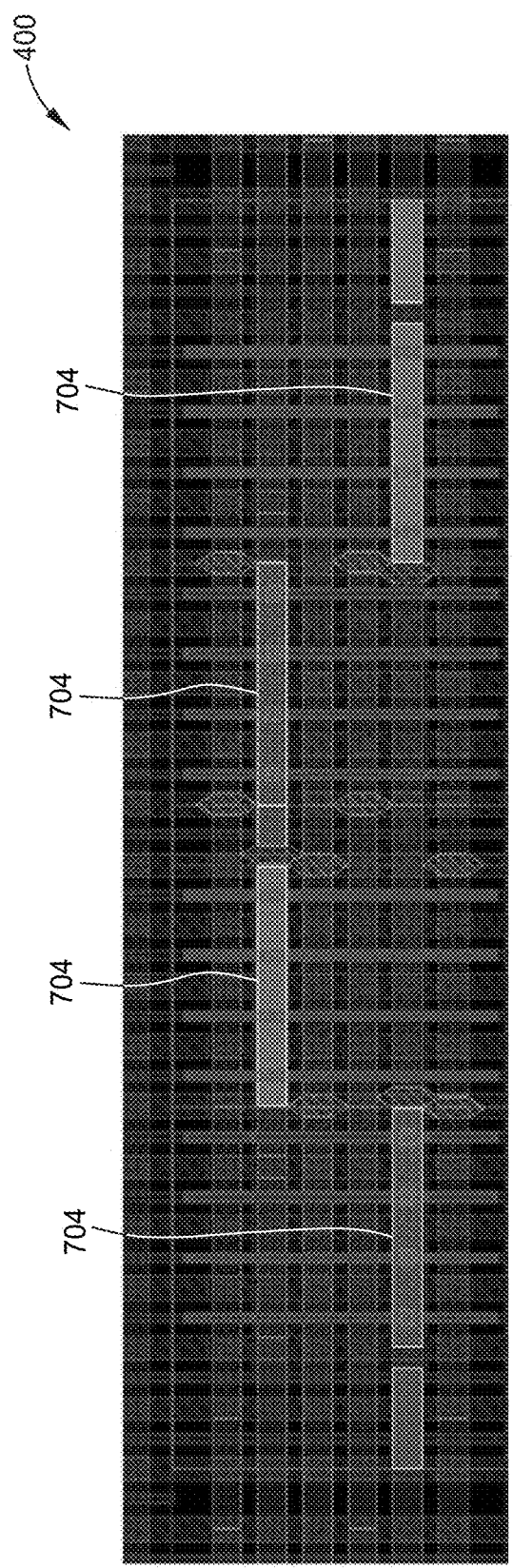

FIGS. 7A and 7B illustrate the example layout 400 with regions 702 selected for cutting. The EDA system allows a user to manually select areas of the layout to automatically cut (Feature #8 described above). In the example of FIG. 7A, the user has selected portions of gate nets 704 for cutting to reduce or minimize capacitance. The selected regions 702 are indicated by a double-headed arrow. The EDA system can automatically cut these regions 702 to produce the result shown in FIG. 7B. The EDA system can also implement the metal cutting using interactive inputs from the user. As seen in FIG. 7B, the selected regions 702 have been cut or removed.

In summary, the described EDA system and layout method includes a collection of features that improve layout efficiency, consistency, quality and inter-operability by providing a user with a desired selection of metal tracks, number of vias per device terminal, and significant automation to get DRC and connectivity clean layout up through the first metals in minutes instead of hours, in certain embodiments. Specifically, the EDA system and layout method may be a collection of the following: (1) A method to take long paths of first horizontal metal that connect to a set of FET devices (e.g., finFET devices or planar FET devices), each with their own terminals, and break the long paths into individual pieces that then connect to each other by abutment, but allow multiple nets down the long horizontal track (path); (2) A method that allows the addition of vias between FET devices and these segmented metal tracks in a programmable way; (3) A method to automatically assign source, drain, and gate vias down a row of abutted devices in such a manner that maximizes the likelihood of being able to later cut the paths. This algorithm can be as simple as using the track farthest away from the previously used tracks; (4) A method to allow connectivity propagation of these small metal segments down a row of FET devices; (5) A method to automatically and/or manually break the long first horizontal metal paths when the net changes by cutting the metal either by breaking the path (gap) or by adding a foundry cut layer which breaks the line during fabrication. This automation can rely on the EDA system's connectivity engine highlighting shorts circuits at the boundary of metal segments; and (6) A method to allow easy selection from a set of optimal configurations for each FET device and circuit application that sets the preferred number of horizontal metal tracks, metal track widths, via sizes, and via locations automatically (e.g., presets).

Further, the described EDA system and layout method provide an enhanced PCELL in which the first metal (horizontal) and connectivity are embedded in the PCELL. In some embodiments, the first horizontal metal is on the second metal layer. In this case, the PCELLs draw vertical first metal (M1) over the source, drain, and gate connections, and then the PCELL has parameters to draw the horizontal second metal wires (tracks)) (M2) and vias are between M1 and M2 instead of between device layers and the first metal. In these cases, the enhanced PCELL will include both first and second metals and all described features for connectivity propagation and short connection will be implemented on second metal.

In addition, this disclosure details a specific implementation where metals are pushed down into the PCELL and the EDA system provides the ability to cut and/or break the metal in the PCELL in an automated LVS aware and DRC clean way. The described EDA system and layout method can also support other implementations where other methods are used to break connectivity of the metals drawn by the PCELL in order to prevent connectivity shorts.

Figure 8:
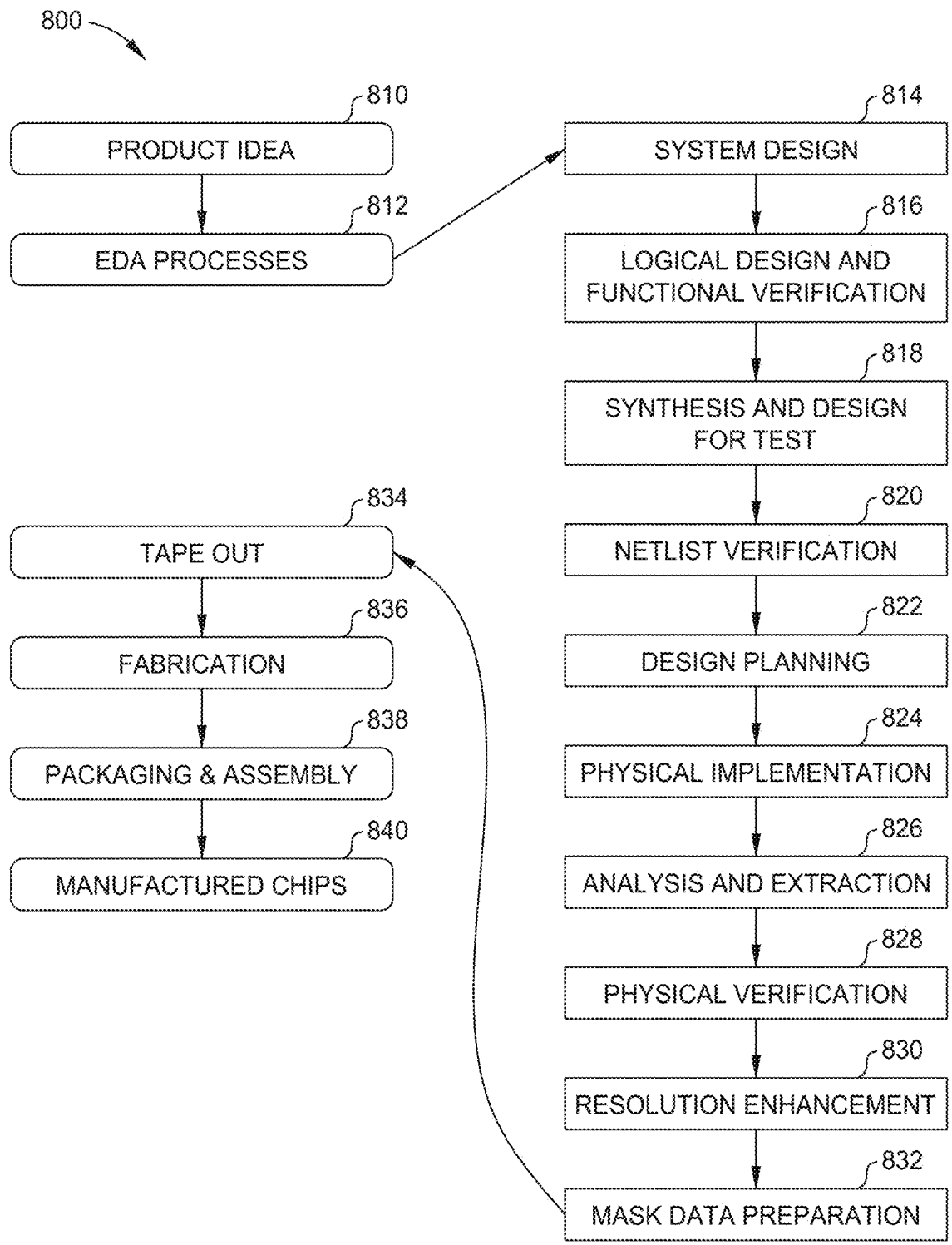
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a user, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 8. The processes described by be enabled by EDA products (or tools).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   instantiating a first parameterized cell (PCELL) into a first region of a row of an electrical circuit design, the first PCELL comprising:
   field effect transistor (FET) data representing a FET structure having a horizontal dimension; and first metal track data representing a first set of adjustable parallel metal line segments extending along the horizontal dimension of the FET structure and positioned above the FET structure;
instantiating a second PCELL into a second region of the row, the second region is adjacent to the first region, the second PCELL comprising second metal track data representing a second set of adjustable parallel metal line segments;
connecting the first set of adjustable parallel metal line segments to the second set of adjustable parallel metal line segments;
inserting a cut shape above a connectivity short; and
eliminating the connectivity short by breaking a connection between a first metal line segment of the first set of adjustable parallel metal line segments and a second metal line segment of the second set of adjustable parallel metal line segments at a location corresponding to the cut shape and such that the first metal line segment remains on a same metal track as the second metal line segment.

2. The method of claim 1, further comprising adjusting an instance terminal of the first metal line segment after eliminating the connectivity short.

3. The method of claim 1, wherein the first PCELL further comprises via/contact data representing a plurality of via/contact structures, each via/contact structure of the plurality of via/contact structures operably connected between one of a source terminal, a drain terminal, and a gate terminal of the FET structure and a metal line segment of the first set of adjustable parallel metal line segments.

4. The method of claim 3, wherein a first via/contact structure of the plurality of via/contact structures and a second via/contact structure of the plurality of via/contact structures are operably connected between the source terminal and a metal line segment of the first set of adjustable parallel metal line segments.

5. The method of claim 3, further comprising setting a location of a via/contact structure of the plurality of via/contact structures based on connections between the first set of adjustable parallel metal line segments and the source, drain, and gate terminals.

6. The method of claim 3, further comprising detecting the connectivity short based on the first metal track data, the second metal track data, and the via/contact data.

7. The method of claim 3, wherein the first set of adjustable parallel metal line segments and the plurality of via/contact structures are design rule check (DRC) compliant.

8. The method of claim 1, wherein a location of the connectivity short corresponds to a location of an abutment between the second metal line segment and the first metal line segment.

9. The method of claim 8, further comprising highlighting the location of the abutment to indicate the connectivity short.

10. The method of claim 1, further comprising placing a guard ring structure or end cell around the FET structure.

11. The method of claim 1, wherein the first PCELL and the second PCELL are selected from a set of PCELLs and the first region and the second region are selected from a set of regions in the row.

12. The method of claim 1, further comprising removing a portion of a third metal line segment of the first set of adjustable parallel metal line segments, the portion extending to an edge of the second metal line segment.

13. An apparatus comprising:
a memory; and
a hardware processor communicatively coupled to the memory, the hardware processor configured to:
instantiate a first PCELL into a first region of a row of an electrical circuit design, the first PCELL comprising:
field effect transistor (FET) data representing a FET structure having a horizontal dimension and comprising a source terminal, a drain terminal, and a gate terminal;
first metal track data representing a first set of adjustable parallel metal line segments extending along the horizontal dimension of the FET structure and positioned above the FET structure; and
via/contact data representing a plurality of via/contact structures, each via/contact structure of the plurality of via/contact structures operably connected between one of the source terminal, the drain terminal, and the gate terminal and a metal line segment of the first set of adjustable parallel metal line segments;
instantiate a second PCELL into a second region of the row, the second region is adjacent to the first region, the second PCELL comprising second metal track data representing a second set of adjustable parallel metal line segments;
connect the first set of adjustable parallel metal line segments to the second set of adjustable parallel metal line segments;
insert a cut shape above a connectivity short; and
eliminate the connectivity short by breaking a connection between a first metal line segment of the first set of adjustable parallel metal line segments and a second metal line segment of the second set of adjustable parallel metal line segments at a location corresponding to the cut shape and such that the first metal line segment remains on a same metal track as the second metal line segment.

14. The apparatus of claim 13, wherein the hardware processor is further configured to adjust an instance terminal of the first metal line segment after eliminating the connectivity short.

15. The apparatus of claim 13, wherein a first via/contact structure of the plurality of via/contact structures and a second via/contact structure of the plurality of via/contact structures are operably connected between the source terminal and a metal line segment of the first set of adjustable parallel metal line segments.

16. The apparatus of claim 13, wherein the hardware processor is further configured to adjust a location of a via/contact structure of the plurality of via/contact structures based on connections between the first set of adjustable parallel metal line segments and the source, drain, and gate terminals.

17. The apparatus of claim 13, wherein the hardware processor is further configured to detect the connectivity short based on the first metal track data, the second metal track data, and the via/contact data.

18. The apparatus of claim 17, wherein a location of the connectivity short corresponds to a location of an abutment between the second metal line segment and the first metal line segment.

19. A layout comprising:
a first parameterized cell (PCELL) in a first region of a row of an electrical circuit design, the first PCELL comprising:

field effect transistor (FET) data representing a FET structure having a horizontal dimension; and first metal track data representing a first set of adjustable parallel metal line segments extending along the horizontal dimension of the FET structure and positioned above the FET structure; and a second PCELL in a second region of the row, the second region is adjacent to the first region, the second PCELL comprising second metal track data representing a second set of adjustable parallel metal line segments, the first set of adjustable parallel metal line segments are connected to the second set of adjustable parallel metal line segments, wherein:

a cut shape was inserted above a connectivity short; and the connectivity short was eliminated by breaking a connection between a first metal line segment of the first set of adjustable parallel metal line segments and a second metal line segment of the second set of adjustable parallel metal line segments at a location corresponding to the cut shape and such that the first metal line segment remains on a same metal track as the second metal line segment.

\* \* \* \* \*